(12) United States Patent
Dorf et al.

(10) Patent No.: US 9,129,777 B2
(45) Date of Patent: Sep. 8, 2015

(54) ELECTRON BEAM PLASMA SOURCE WITH ARRAYED PLASMA SOURCES FOR UNIFORM PLASMA GENERATION

(75) Inventors: Leonid Dorf, San Jose, CA (US); Shahid Rauf, Pleasanton, CA (US); Kenneth S. Collins, San Jose, CA (US); Nipun Misra, San Jose, CA (US); James D. Carducci, Sunnyvale, CA (US); Gary Leray, Mountain View, CA (US); Kartik Ramaswamy, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 476 days.

(21) Appl. No.: 13/595,201

(22) Filed: Aug. 27, 2012

(65) Prior Publication Data

US 2013/0098551 A1    Apr. 25, 2013

Related U.S. Application Data

(60) Provisional application No. 61/549,340, filed on Oct. 20, 2011.

(51) Int. Cl.
*C23F 1/08* (2006.01)
*H01J 37/32* (2006.01)

(52) U.S. Cl.
CPC ....... *H01J 37/3233* (2013.01); *H01J 37/32082* (2013.01)

(58) Field of Classification Search
None
See application file for complete search history.

(56) References Cited

U.S. PATENT DOCUMENTS

| | | | |
|---|---|---|---|
| 3,755,073 A | 8/1973 | Haught et al. | |
| 5,003,178 A | 3/1991 | Livesay | |
| 5,368,676 A | 11/1994 | Nagaseki et al. | |
| 5,539,274 A | 7/1996 | Araki et al. | |
| 5,874,807 A | 2/1999 | Neger et al. | |
| 5,903,106 A | 5/1999 | Young et al. | |
| 6,116,187 A | 9/2000 | Murakami et al. | |
| 6,211,622 B1 * | 4/2001 | Ryoji et al. | 315/111.21 |
| 6,291,940 B1 | 9/2001 | Scholte Van Mast | |
| 6,348,158 B1 | 2/2002 | Samukawa | |
| 6,356,026 B1 | 3/2002 | Murto | |
| 6,407,399 B1 | 6/2002 | Livesay | |
| 6,452,338 B1 | 9/2002 | Horsky | |
| 6,501,081 B1 | 12/2002 | Foad et al. | |

(Continued)

FOREIGN PATENT DOCUMENTS

IL    WO2011024174    *    3/2011
JP    08-222553 A         8/1996

(Continued)

OTHER PUBLICATIONS

Official Action Dated Dec. 24, 2014 Issued in Related U.S. Appl. No. 13/595,292.

(Continued)

*Primary Examiner* — Joseph Miller, Jr.
(74) *Attorney, Agent, or Firm* — Robert M. Wallace (57) ABSTRACT

A plasma reactor that generates plasma in workpiece processing chamber by a electron beam, has an electron beam source chamber and an array of plasma sources facing the electron beam source chamber for affecting plasma electron density in different portions of the processing chamber. In another embodiment, an array of separately controlled electron beam source chambers is provided.

16 Claims, 10 Drawing Sheets

(56) References Cited

U.S. PATENT DOCUMENTS

| | | |
|---|---|---|
| 7,470,329 B2 | 12/2008 | Oehrlein et al. |
| 7,547,899 B2 | 6/2009 | Vanderpot et al. |
| 7,734,014 B2 | 6/2010 | Bergmann et al. |
| 2002/0004309 A1 | 1/2002 | Collins et al. |
| 2002/0078893 A1 | 6/2002 | Os et al. |
| 2002/0168049 A1 | 11/2002 | Schriever et al. |
| 2004/0104353 A1 | 6/2004 | Berglund |
| 2007/0040130 A1 | 2/2007 | Nanataki et al. |
| 2007/0170414 A1 | 7/2007 | Takai et al. |
| 2007/0278417 A1 | 12/2007 | Horsky et al. |
| 2009/0140176 A1 | 6/2009 | Hershkowitz et al. |
| 2009/0159811 A1 | 6/2009 | Klemm et al. |
| 2010/0032587 A1 | 2/2010 | Hosch et al. |
| 2011/0024047 A1 | 2/2011 | Nguyen et al. |
| 2012/0258601 A1 | 10/2012 | Holland et al. |
| 2012/0258606 A1 | 10/2012 | Holland et al. |
| 2012/0258607 A1 | 10/2012 | Holland et al. |
| 2014/0035458 A1 | 2/2014 | Wu et al. |

FOREIGN PATENT DOCUMENTS

| | | |
|---|---|---|
| JP | 2001-085414 A | 3/2001 |
| KR | 10-2005-0008065 A | 1/2005 |
| KR | 10-2007-0041220 A | 4/2007 |
| KR | 10-2009-0008932 A | 1/2009 |
| KR | 10-2010-0042610 A | 4/2010 |

OTHER PUBLICATIONS

U.S. Appl. No. 14/176,365, filed Feb. 10, 2014, Dorf et al.
Official Action Issued Jul. 31, 2014 in Corresponding U.S. Appl. No. 13/595,292.
Official Action Issued Aug. 6, 2014 in Corresponding U.S. Appl. No. 13/595,452.
U.S. Appl. No. 13/595,452, filed Aug. 27, 2012, Bera et al.
U.S. Appl. No. 13/595,134, filed Aug. 27, 2012, Dorf et al.
U.S. Appl. No. 13/595,252, filed Aug. 27, 2012, Dorf et al.
U.S. Appl. No. 13/595,292, filed Aug. 27, 2012, Dorf et al.
U.S. Appl. No. 13/595,351, filed Aug. 27, 2012, Bera et al.
U.S. Appl. No. 13/595,655, filed Aug. 27, 2012, Ramaswamy et al.
U.S. Appl. No. 13/595,612, filed Aug. 27, 2013, Bera et al.
Furman, M.A., et al. "Stimulation of Secondary Electron Emission Based Upon a Phenomenological . . . " LBNL-52807/SLAC-PUB-9912, Jun. 2, 2003, pp. 1-31, Lawrence Berkely Natl. Lab.
Official Action Dated Nov. 25, 2014 Issued in Related U.S. Appl. No. 13/595,612.

* cited by examiner

ELECTRON BEAM PLASMA SOURCE WITH ARRAYED PLASMA SOURCES FOR UNIFORM PLASMA GENERATION

CROSS-REFERENCE TO RELATED APPLICATIONS

This application claims the benefit of U.S. Provisional Application Ser. No. 61/549,340, filed Oct. 20, 2011 entitled ELECTRON BEAM PLASMA SOURCE WITH ARRAYED PLASMA SOURCES FOR UNIFORM PLASMA GENERATION, by Leonid Dorf, et al.

BACKGROUND

A plasma reactor for processing a workpiece can employ an electron beam as a plasma source. Such a plasma reactor can exhibit non-uniform distribution of processing results (e.g., distribution of etch rate across the surface of a workpiece) due to non-uniform distribution of electron density and/or kinetic energy within the electron beam. Such non-uniformities can be distributed along the direction of beam propagation and can also be distributed in a direction transverse to the beam propagation direction.

SUMMARY

A plasma reactor for processing a workpiece, includes a workpiece processing chamber having a processing chamber enclosure comprising a ceiling and a side wall and an electron beam opening in said side wall, a workpiece support pedestal in said processing chamber having a work lace support surface facing said ceiling and defining a workpiece processing region between said workpiece support surface and said ceiling, said electron beam opening facing said workpiece processing region. The plasma reactor further comprises an electron beam source chamber comprising an electron beam source chamber enclosure that is open to said electron beam opening of said workpiece processing chamber, and an array of plasma sources distributed along a portion of said electron beam source chamber enclosure opposite from said electron beam opening, each of said plasma sources comprising a supply of plasma source power and a plasma source power applicator coupled to the supply of plasma source power. A controller governs each supply of plasma source power of each of said plasma sources.

The array of plasma sources is distributed along direction parallel with a plane of said workpiece support surface.

The plasma sources affect plasma electron density in respective portions of said electron beam source chamber, said respective portions distributed along a direction parallel with a plane of said workpiece support surface. The plasma reactor of claim 3 wherein said controller governs plasma electron density distribution along said direction.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1A:
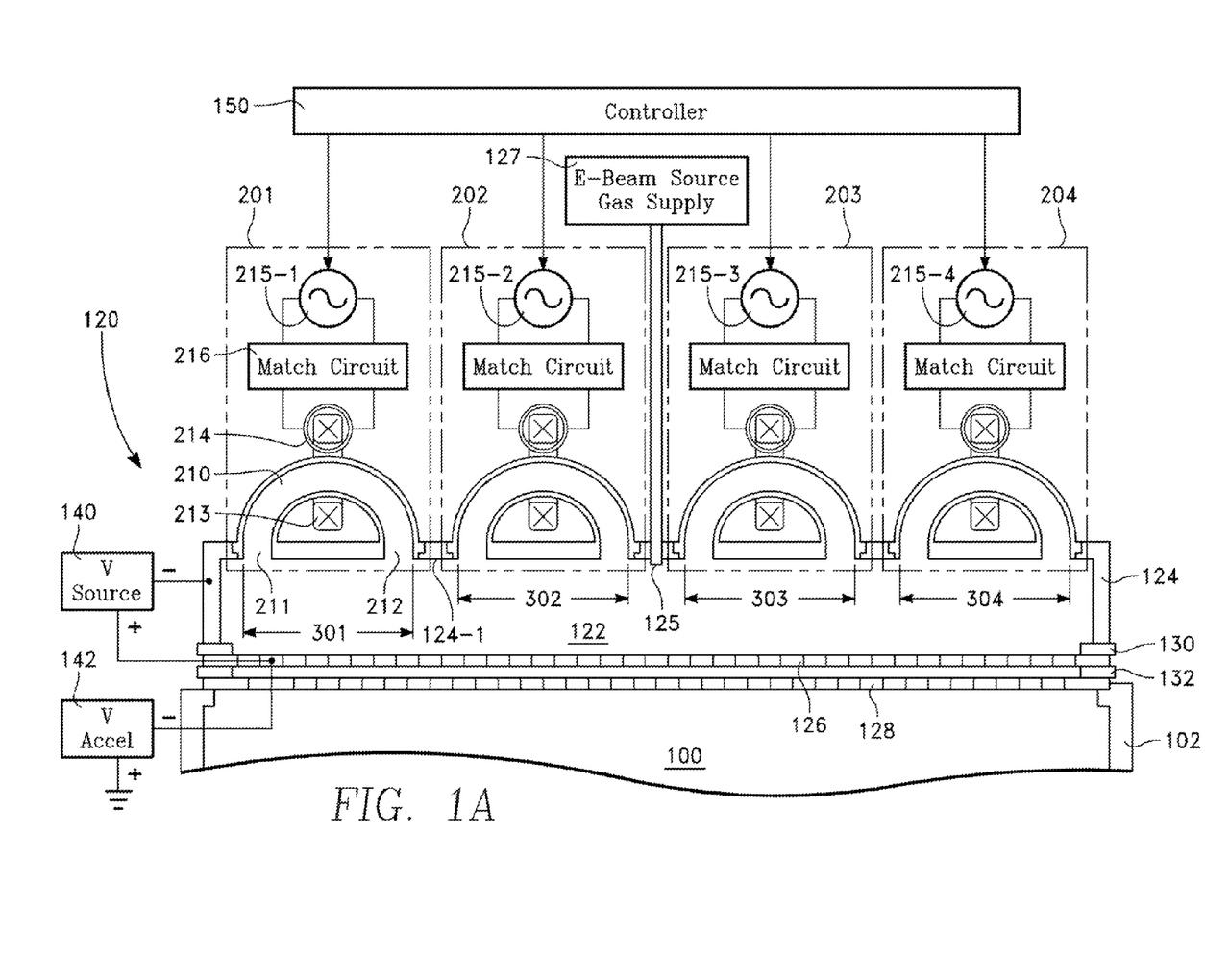
FIGS. 1A and 1B are top and side views, respectively, of a plasma reactor employing an electron beam to produce a plasma in a workpiece processing chamber, and of the electron beam source including an array of toroidal plasma sources, in accordance with a first embodiment.
Figure 1B:
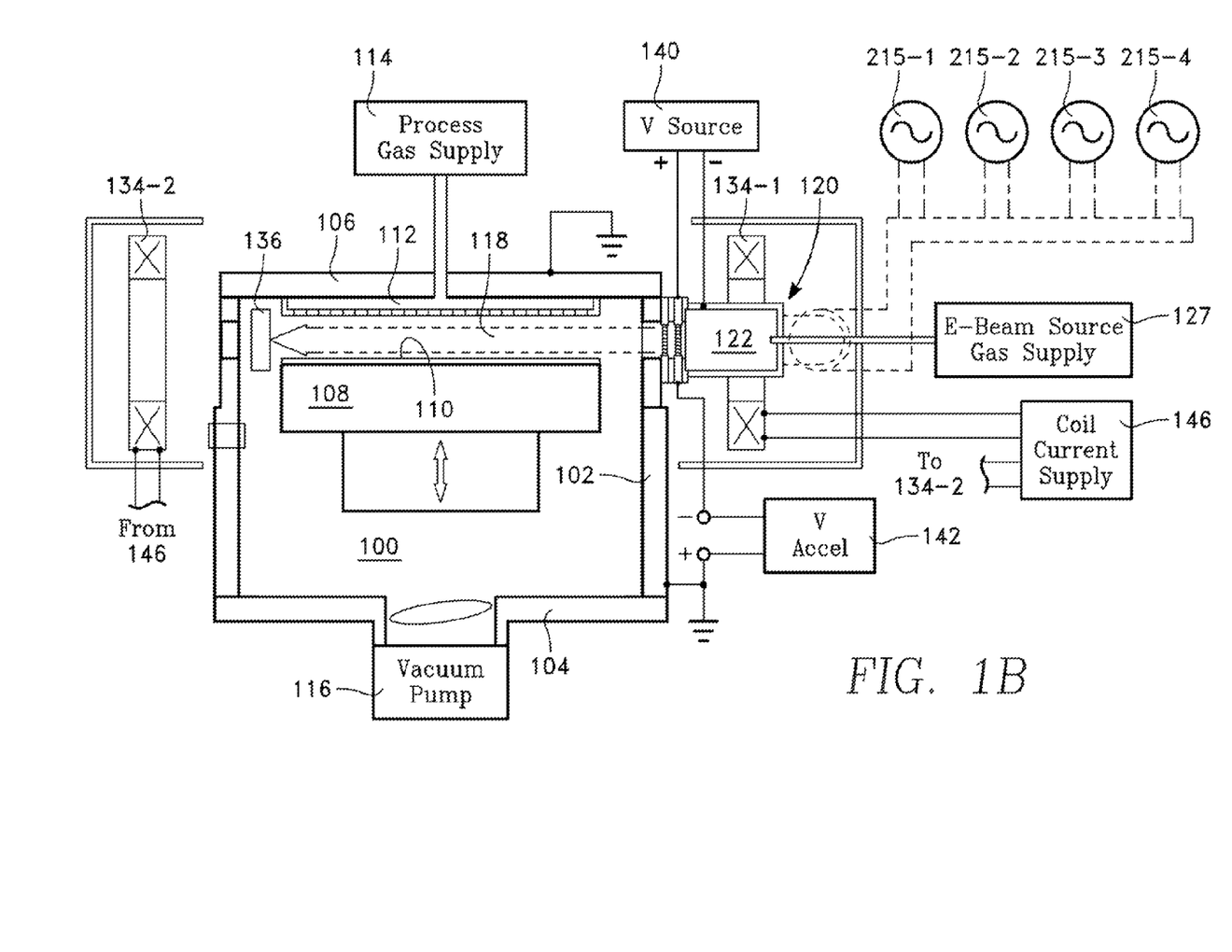

FIGS. 1A and 1F are top and side views, respectively, of a plasma reactor having an electron beam plasma source employing a configurable array of plasma sources affecting uniformity of an electron beam, in accordance with a first embodiment. The reactor includes a process chamber 100 enclosed by a cylindrical side wall 102, a floor 104 and a ceiling 106. A workpiece support pedestal 108 supports a workpiece 110, such as a semiconductor wafer, the pedestal. 108 being movable in the axial (e.g., vertical) direction. A gas distribution plate 112 is integrated with or mounted on the ceiling 106, and receives process gas from a process gas supply 114. A vacuum pump 116 evacuates the chamber through the floor 104. A process region 118 is defined between the workpiece 110 and the gas distribution plate 112. Within the process region 118, the process gas is ionized to produce a plasma for processing of the workpiece 110.

The plasma is generated in the process region 118 of the process chamber 100 by an electron beam from an electron beam source 120. The electron beam source 120 includes a plasma generation chamber 122 outside of the process chamber 100 and having a conductive enclosure 124. The conductive enclosure 124 has a gas inlet or neck. 125. An electron beam source gas supply 127 is coupled to the gas inlet 125. The conductive enclosure 124 has an opening 124a facing the process region 118 through an opening 102a in the sidewall 102 of the process chamber 100 through which the electron beam enters the process chamber 100.

Figure 1C:
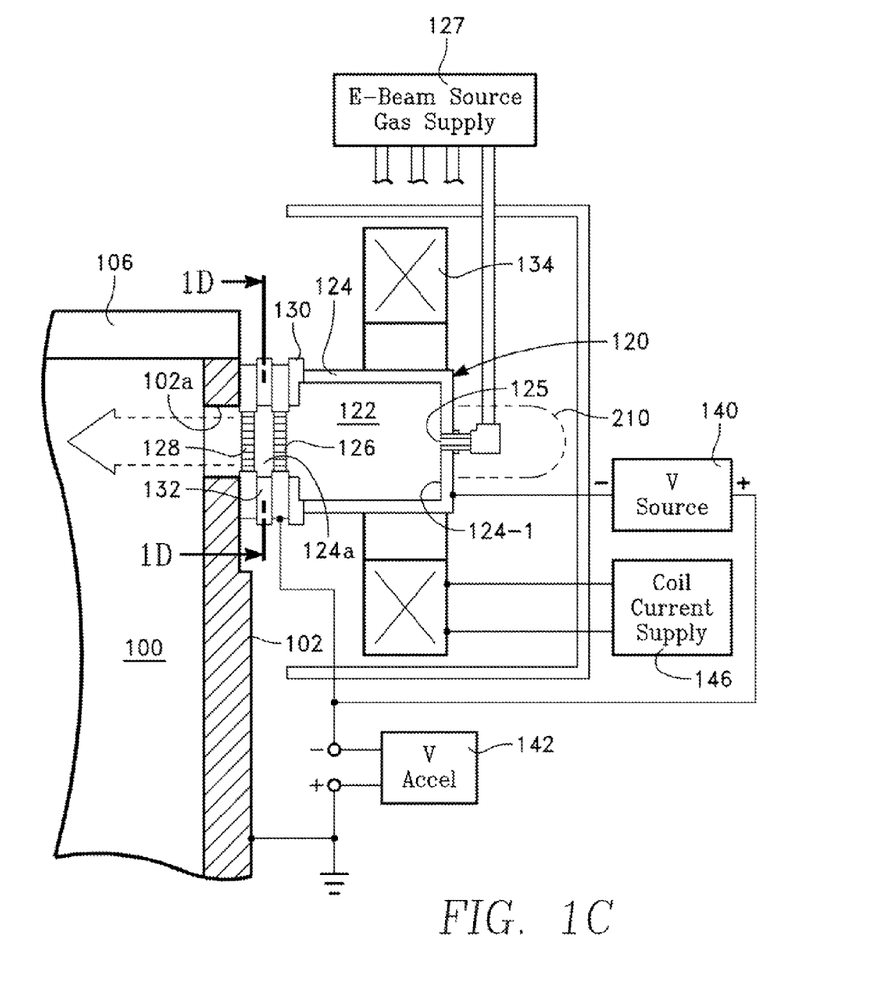
FIG. 1C is an enlarged view of a portion of FIG. 1B.

The electron beam source 120 includes an extraction grid 126 between the opening 124a and the plasma generation chamber 122, and an acceleration grid 128 between the extraction grid 126 and the process region 118, best seen in the enlarged view of FIG. 1C. The extraction grid 126 and the acceleration grid 128 may be formed as separate conductive meshes, for example. The extraction grid 126 and the acceleration grid 128 are mounted with insulators 130, 132, respectively, so as to be electrically insulated from one another and from the conductive enclosure 124. However, the acceleration grid 128 is in electrical contact with the side wall 102 of the chamber 100. The openings 124a and 102a and the extraction and acceleration grids 126, 128 are mutually congruent, generally, and define a thin wide flow path for an electron beam into the processing region 118. The width of the flow path is about the diameter of the workpiece 110 (e.g., 100-500 mm), while the height of the flow path is less than about two inches.

The electron beam source 120 further includes a pair of electromagnets 134-1 and 134-2 aligned with the electron beam source 120, and producing a magnetic field parallel to the direction of the electron beam. The electron beam flows across the processing region 118 over the workpiece 110, and is absorbed on the opposite side of the processing region 118 by a beam dump 136. The beam dump 136 is a conductive body having a shape adapted to capture the wide thin electron beam.

Figure 1D:
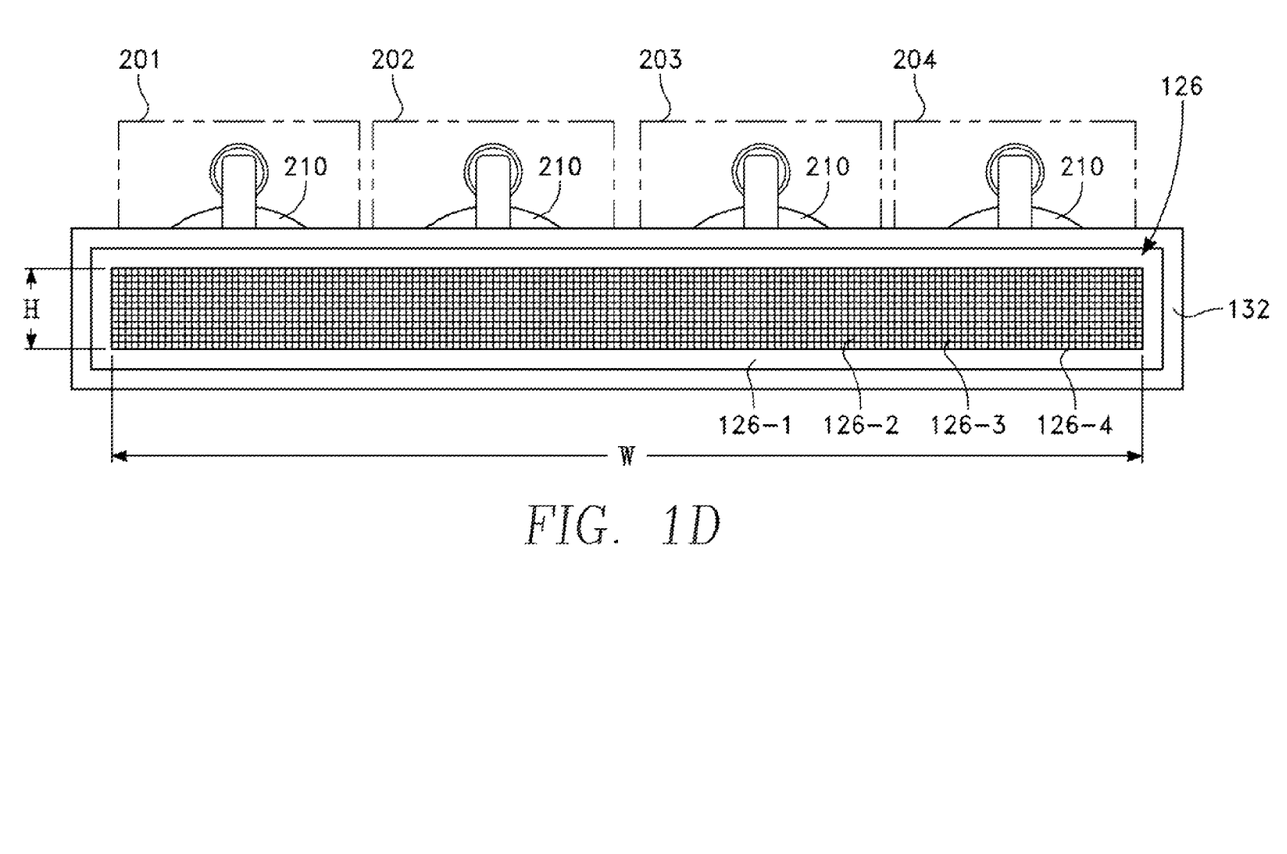
FIG. 1D is a cross-sectional view taken along lines 1D-1D of FIG. 1C.

A negative terminal of plasma D.C. discharge voltage supply 140 is coupled to the conductive enclosure 124, whereas a positive terminal of the voltage supply 140 is connected to the extraction grid 126. In turn, a negative terminal of an electron beam acceleration voltage supply 142 is connected to the extraction grid 126, and positive terminal is connected to the grounded sidewall 102 of the process chamber 100. The electrons extracted from the DC discharge plasma through the extraction grid 126 are accelerated as they travel towards the acceleration grid 128 by the potential difference (typically of the order of a few kV) provided by the voltage supply 142. In another example, the negative terminal of voltage supply 142 may be coupled to the conductive enclosure 124, instead of the extraction grid 126. In this case, the voltage supply 142 not only performs work to accelerate the electrons, but also to sustain DC discharge. The voltage supply 140, in this case, only performs work on a small portion of a discharge current caused by electrons that do not make it through the openings and bombard the extraction grid. A coil current supply 146 is coupled to the electromagnets 134-1 and 134-2. Plasma is generated within the chamber 122 of the electron beam source 120 by a D.C. gas discharge produced by power from the voltage supply 140, which provides a voltage typically of the order of a few hundred volts. This D.C. gas discharge is the main plasma source of the electron beam source 120. Electrons are extracted from the plasma in the chamber 122 through the extraction grid 126, and accelerated through the acceleration grid 128 due to a voltage difference between the acceleration grid and the extraction grid to produce an electron beam that flows into the processing chamber 100. Distribution of the plasma ion density and plasma electron density across the chamber 122 affects the uniformity of the electron beam. For example, referring to FIG. 1D, the extraction grid 126 includes a frame 126-1 and an array of spaced-apart blocking elements 126-2 defining an array of openings 126-3. The frame 126-1 defines a narrow aperture 126-4 whose height H is relatively small (e.g., 2-4 cm) and whose width W (e.g., on the order of the workpiece diameter, or 300 mm or more) is generally parallel to the workpiece support plane of the pedestal 108, so as to produce a correspondingly thin wide electron beam. The distribution of electron density across the width of the beam is liable to exhibit non-uniformities.

While the main plasma source in the electron beam source 120 is a D.C. gas discharge produced by the voltage supply 140, any other suitable plasma source may be employed instead as the main plasma source. For example, the main plasma source of the electron beam source 120 may be a toroidal RF plasma source, a capacitively coupled RE plasma source, or an inductively coupled RF plasma source.

In the illustrated embodiment, the main plasma source of the electron beam source 120 is the D.C. gas discharge maintained within the chamber 122 by the D.C. discharge voltage supply 140. This main plasma source is augmented by an array of plasma sources 201, 202, 203 and 204 distributed along a direction generally parallel to the workpiece support plane of the pedestal 108. A controller 150 governs the rate at which each plasma source 201, 202, 203 and 204 generates plasma ions and electrons, each plasma source, 201, 202, 203, 204 being controlled independently. The plasma sources 201, 202, 203 and 204 are RF plasma sources employing respective RE power generators 215-1, 215-2, 215-3 and 215-4, and the controller 150 governs the RE power level of each RE generator 215-1, 215-2, 215-3 and 215-4 separately. Each plasma source 201, 202, 203 and 204 faces a region 301, 302, 303 and 304 of the chamber 122. The output power level of each of the RF generators 215-1, 215-2, 215-3 and 215-4 affects plasma ion density and the plasma electron density in the corresponding region 301, 302, 303 and 304 of the chamber 122. The distribution across the electron beam width of electron density reflects the distribution of plasma electron density and plasma ion density along the beam width among the regions 301, 302, 303 and 304 within the electron beam source chamber 122. The controller 150 can therefore adjust plasma electron distribution across the width of the electron beam by changing the proportion of RF power output levels of the RF generators 215-1, 215-2, 215-3 and 215-4. Such adjustments may be made in response to measurements of distribution across a test workpiece (processed in the process chamber 100) of a process parameter (e.g., etch depth). Non-uniformities in distribution may be ameliorated or corrected by increasing RF power for those regions experiencing lower electron density and/or decreasing RF power for those regions experiencing higher electron density.

In the illustrated embodiment, each plasma source 201-204 is a toroidal RF plasma source consisting of an external reentrant conduit 210 having a pair of ports 211, 212 through a back wall 124-1 of the chamber 122, a ring 213 of a magnetically permeable material around the reentrant conduit 210, a conductive coil 214 around the ring 213, and an RF generator (e.g., 215-1, 215-2, 215-4) coupled to the coil 214 through an RF impedance match 216.

Figure 2A:
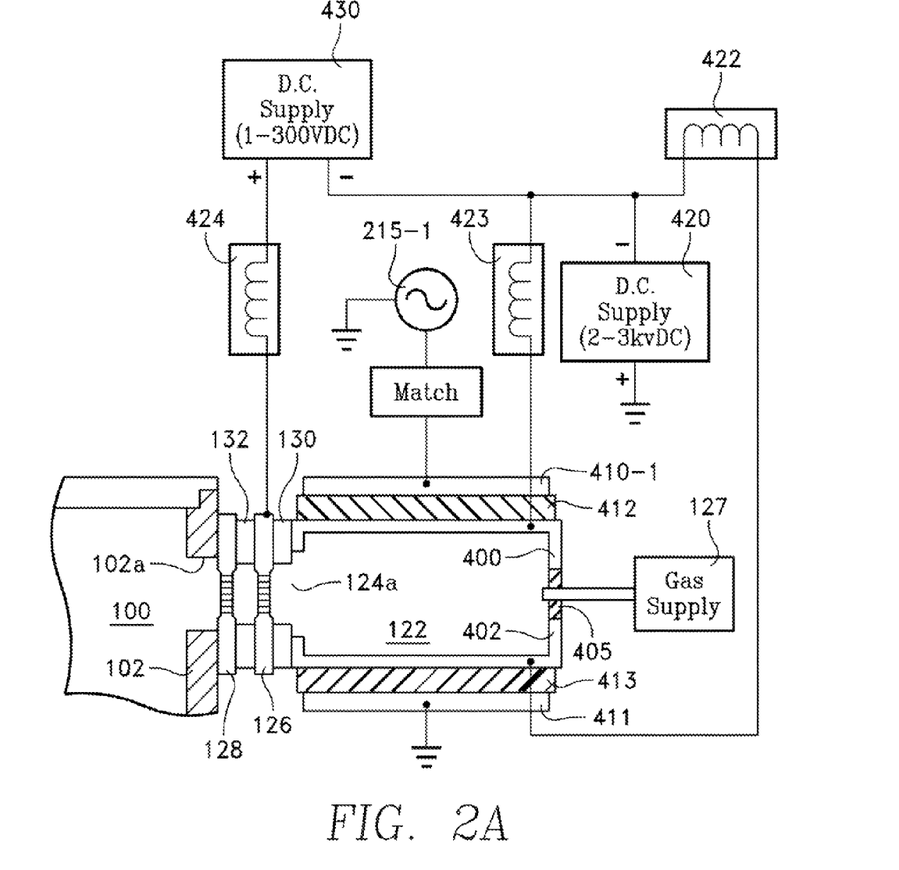
FIGS. 2A, 2B and 2C are side, top and end views, respectively, of a plasma reactor employing an electron beam to produce a plasma in a workpiece processing chamber, and of the electron beam source including an array of capacitively coupled plasma sources, in accordance with a second embodiment.
Figure 2B:
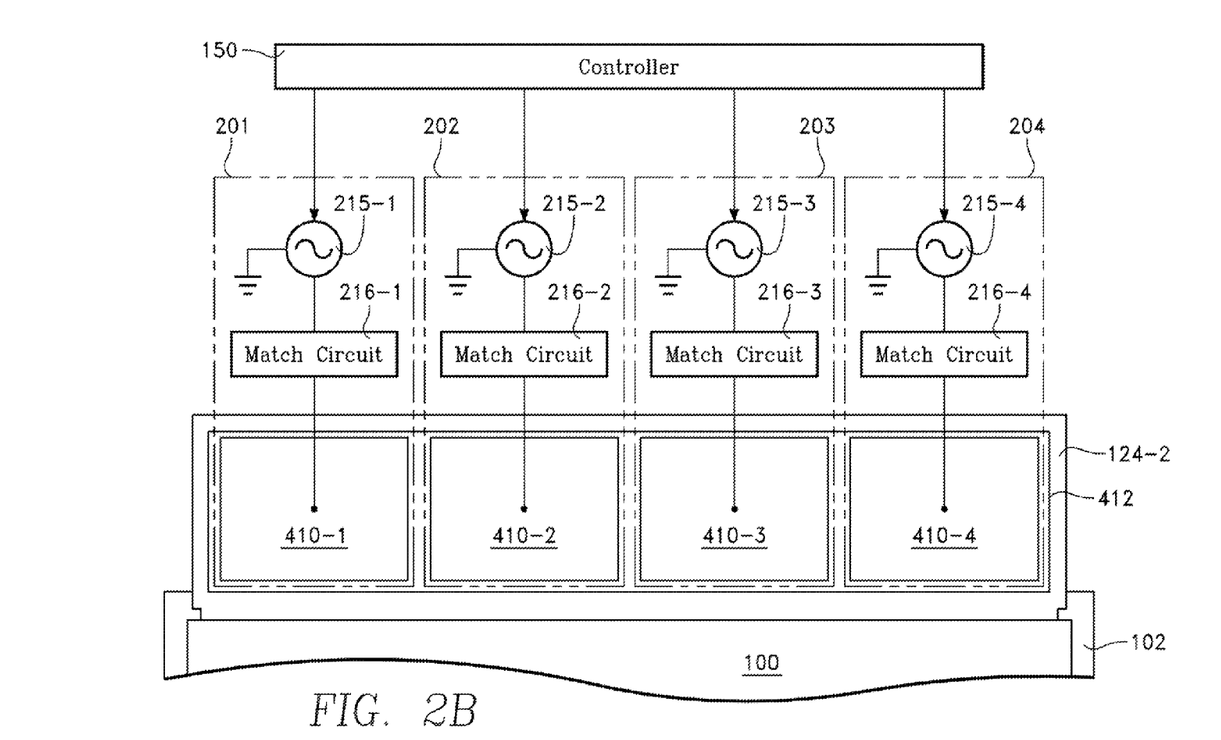
Figure 2C:
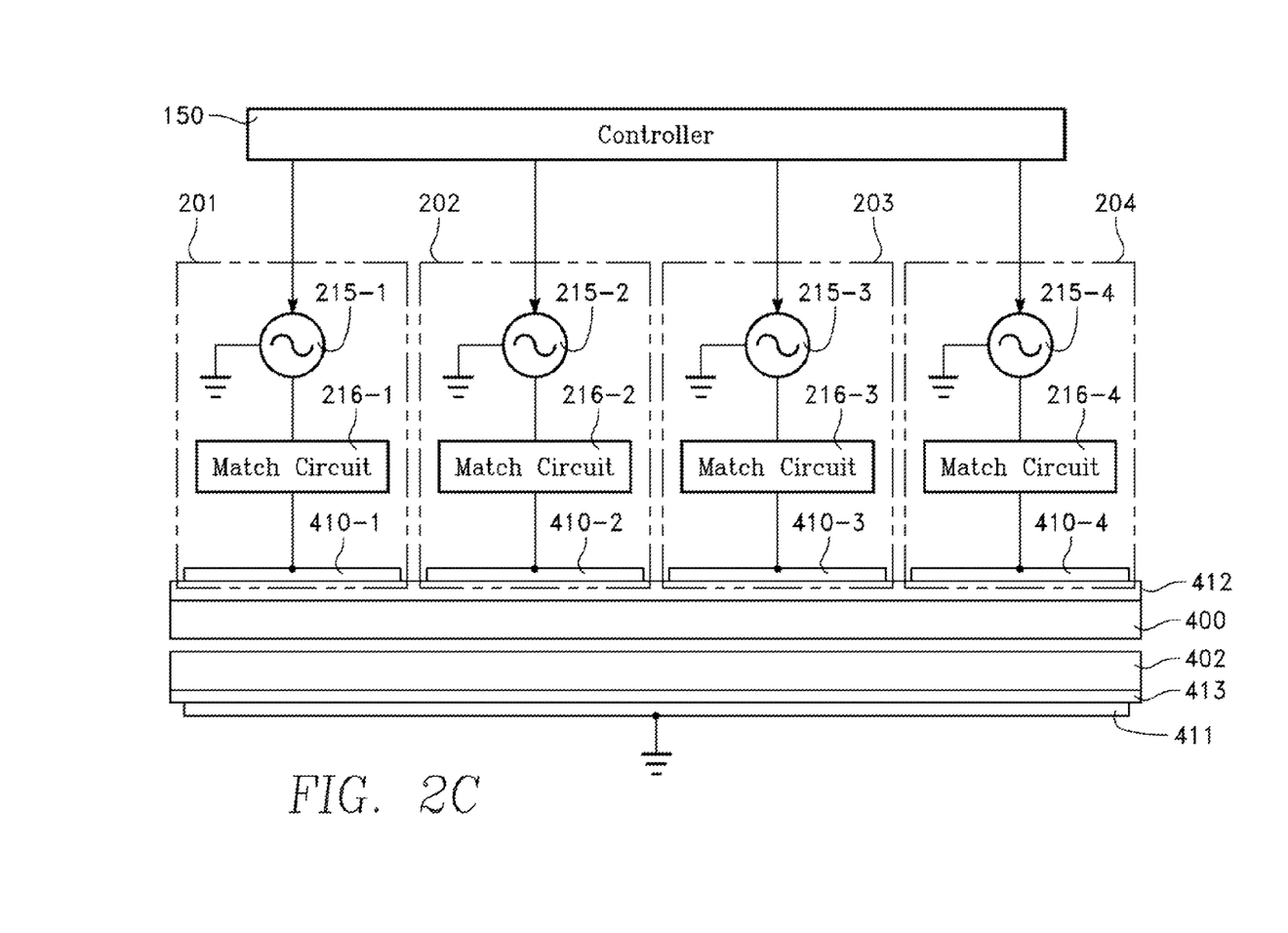

In the embodiment of FIGS. 2A, 2B, 2C, each plasma source 201, 202, 203 and 204 of the electron beam source 120 is a capacitively coupled RF plasma source. In this embodiment, the conductive housing 124 consists of an upper housing 400 and a lower housing 402 separated by the opening 124a and by an insulator 405. An insulator 412 overlies the upper housing 400. The plasma sources 201, 202, 203 and 204 include separate electrodes 410-1, 410-2, 410-2 and 410-4, respectively, overlying the insulator 412. Respective ones of the RF generators 215-1, 215-2, 215-3 and 215-4 are coupled through the individual impedance matches 216-1, 216-2, 214-3 and 216-4 to respective ones of the electrodes 410-1, 410-2, 415-2 and 410-4. An insulator 413 underlies the lower housing 402. A common return (RF ground) electrode 411 underlies the insulator 413. A first D.C. voltage supply 420 referenced to ground is connected to the upper and lower housings 400, 402. The negative terminal of the D.C. voltage supply 420 is connected through a choke inductor 428 to the upper housing 400, and through a choke inductor 422 to the lower housing 402. The choke inductors 422 and 423 enable each RF generator 215-1, 215-2, 215-3 and 215-4 to maintain RF voltage differences between the respective electrodes 410-1, 410-2, 410-2 and 410-4 and the lower housing 402. Considering insulators 412 and 413 as blocking capacitors, the above scheme of connecting both RF and DC voltages to the same points (upper and lower housings 400 and 402) resembles a well-known "bias tee" configuration. The first D.C. voltage supply 420 may provide a voltage in a high range (e.g., 2-3 kV). This voltage will determine the energy that electrons will gain when passing through the gap between the extraction grid 126 and the grounded acceleration grid 128. In another example (not shown in FIG. 2A), a negative terminal of the high-voltage D.C. power supply 420 may be connected through a choke inductor to the extraction grid 126, instead of the upper and lower housings 400, 402. A second D.C. voltage supply 430 is connected between the negative terminal of the first D.C. voltage supply 420 and the extraction grid 126, the positive terminal of the second D.C. voltage supply 430 being connected through a choke inductor 424 to the extraction grid 126, and the negative, terminals of the first and second D.C. voltage supplies 420, 430 being connected together. The second D.C. voltage 430 supply may provide a voltage in a lower range (e.g., 0-300 volts). In one example, this voltage may be small and insufficient to autonomously produce and sustain a D.C. discharge. In this case, DC discharge is not the main plasma source for the electron beam source 120. In this example, plasma is produced mostly by the capacitively coupled RF sources, and the DC voltage from the supply 430 is provided primarily to eliminate an electron-repelling sheath at the discharge side of the extraction grid, and thus ensure that electrons can leave the e-beam discharge chamber through the extraction grid.

Figure 3A:
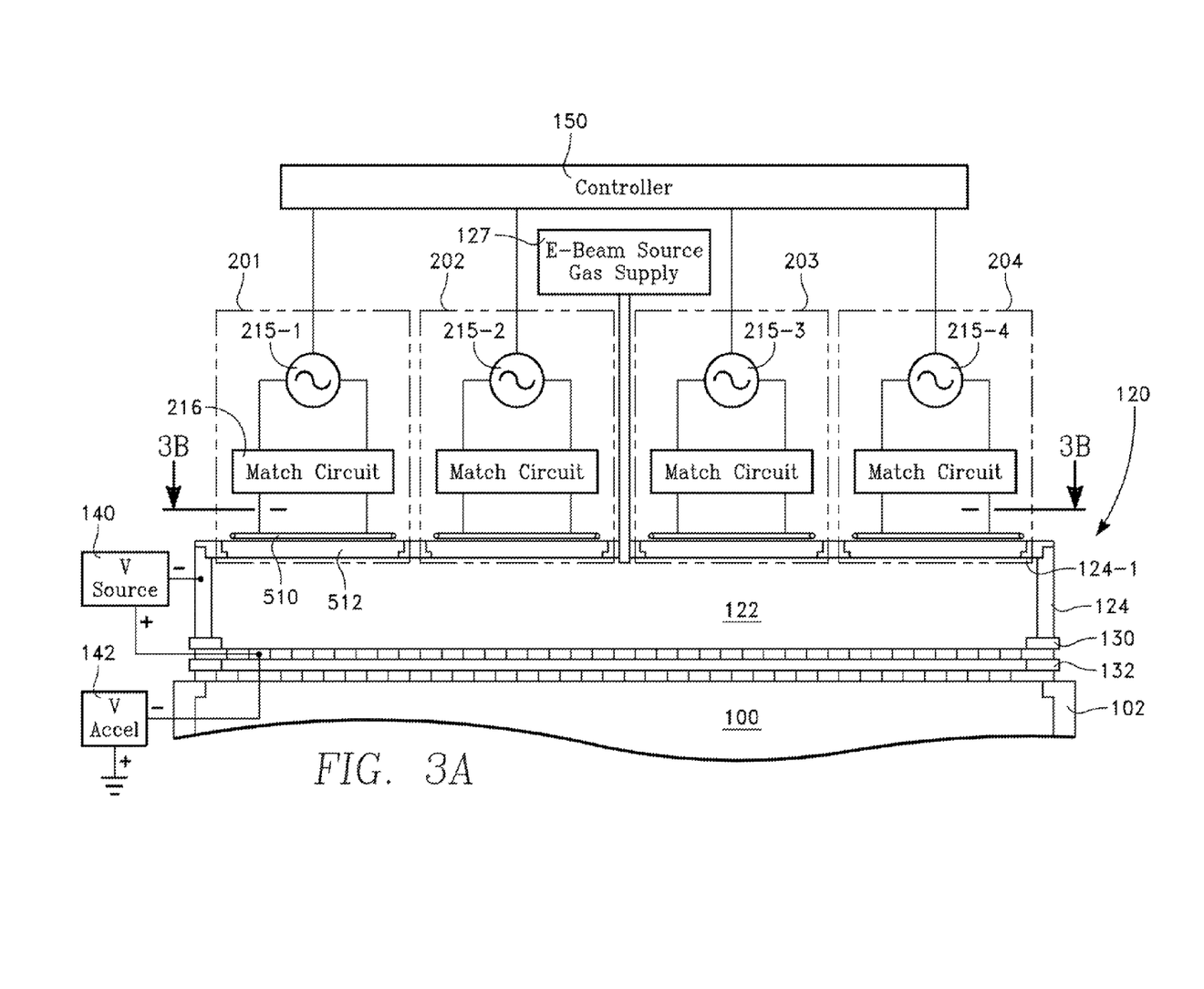
FIGS. 3A and 3B are side and end views, respectively, of a plasma reactor employing an electron beam to produce a plasma in a workpiece processing chamber, and of the electron beam source including an array of inductively coupled plasma sources, in accordance with a third embodiment.
Figure 3B:
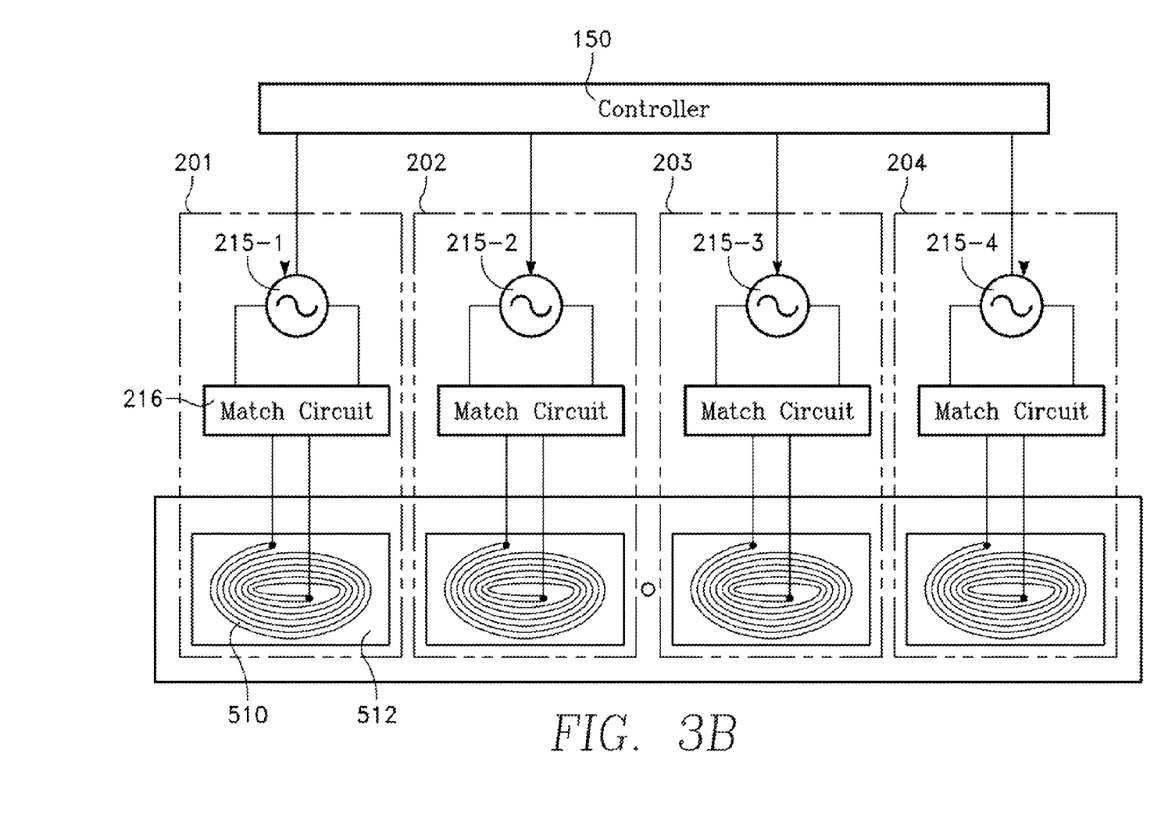

In the embodiment of FIGS. 3A and 3B, each one of the array of plasma source 201, 202, 203 and 204 of the electron beam source 120 is an inductively coupled RF plasma source, that includes a coil antenna 510 mounted over a dielectric window 512 formed on the back well 124-1 of the chamber 122, and a respective one of the RF generators 215-1, 215-2, 215-3 and 215-4 coupled to the of 510 through a respective one of the RF impedance matches 216.

Figure 4:
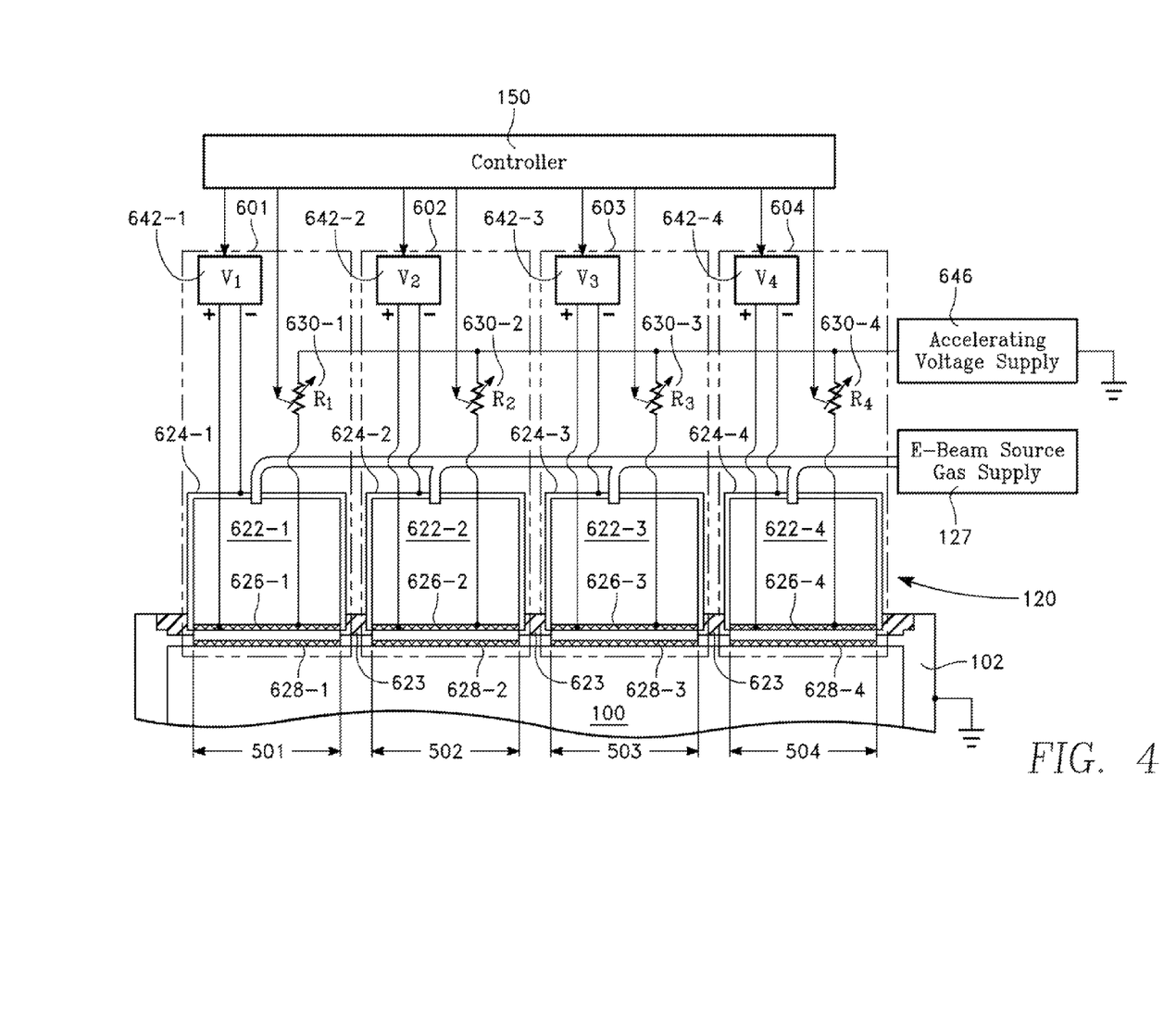
FIG. 4 is a top view of a plasma reactor employing an electron beam to produce a plasma is a workpiece processing chamber, and of the electron beam source including an array of separate electron beam source chambers, in accordance with a fourth embodiment.

In each of the foregoing embodiments, the electron beam source 120 has a single plasma source chamber 122 extending across the entire width of the plasma beam, corresponding to the width of the process region 118 of the process chamber 100. In the embodiment of FIG. 4, the electron beam source 120 is provided with an array of plasma sources 601, 602, 603 and 604 constituting separate smaller chambers distributed across the width of the electron beam. Each of the plasma sources 601, 602, 603 and 604 has a respective chamber 622-1, 522-2, 622-3 and 622-4 isolated from each other by insulators 623. D.C. discharge voltage supplies 642-1, 642-2, 642-3 and 642-4 are connected between the walls of the respective chambers 622-1, 622-2, 622-3 and 622-4 and respective extraction grids 626-1, 626-2, 626-3 and 626-4. The voltages V1, V2, V3 and V4 are independently controlled by the controller 150, so that each chamber may be provided with different gas discharge voltages, so as to produce different electron densities. The chambers 622-1, 622-2, 622-3 and 622-4 are open toward the processing chamber 100 through the respective extraction grids 626-1, 626-2, 626-3 and 626-4 and respective acceleration grids 628-1, 628-2, 628-3 and 628-4. An accelerating voltage supply 646 is coupled to the extraction grids 626-1, 626-2, 626-3 and 626-4 through respective variable resistors 630-1, 630-2, 630-3 and 630-4, and is referenced to ground. The variable resistors 630-1, 630-2, 630-3 and 630-4 are independently controlled by the controller 150, so that each extraction grid may be provided a different accelerating voltage, so as to accelerate beam electrons to different energies.

The four plasma sources 601, 602, 603 and 604 face respective regions 501, 502, 503, and 504 of the processing chamber 100 and affect electron (and ion) density within those regions. The four plasma sources can provide different amounts of plasma to the different regions 501, 502, 503, and 504. The different D.C. discharge voltages provided to the e-beam sources 601, 602, 603 and 604 affect plasma ion density and the plasma electron density in the corresponding regions 501, 502, 503 and 504 of the processing chamber 100. The distribution of electron density across the combined electron beam width (from all 4 sources) reflects the distribution of plasma electron density and plasma ion density along the beam width among the regions 501, 502, 503 and 504 within the processing chamber 100. The controller 150 can therefore adjust plasma density distribution across the width of the electron beam by adjusting the voltages 642-1, 642-2, 642-3 and 642-4 to provide different D.C. gas discharge voltages to the different chambers 622-1, 622-2, 622-3 and 622-4. Such adjustments may be made in response to measurements of distribution across a test workpiece (processed in the process chamber 100) of a process parameter (e.g., etch depth).

In addition to providing different densities of beam electrons in the different regions 501, 502, 503, and 504, the plasma sources 601, 602, 603 and 604 may provide different energies of beam electrons in the different regions. This is done by the controller 150 adjusting the variable resistors 630-1, 630-2, 630-3 and 630-4. This may be one so as to compensate for non-uniformities in the distribution of plasma density in the chamber 100. Such non-uniformities may be detected by measuring process results on a test workpiece. While the electron energy levels of the different plasma sources 601-604 are depicted as being controlled by different variable resistors 630-1, 630-2, 630-3, 640-4 from a shared accelerating voltage supply 646, in one modification the same control may be realized by providing separate accelerating voltage supplies (not illustrated) controlled by the controller 150, rather than separate variable resistors.

While the foregoing is directed to embodiments of the present invention, other and further embodiments of the invention may be devised without departing from the basic scope thereof, and the scope thereof is determined by the claims that follow.

What is claimed is:

1. A plasma reactor for processing a workpiece, comprising:
   a workpiece processing chamber having a processing chamber enclosure comprising a ceiling and a side wall and an electron beam opening in said side wall, a workpiece support pedestal in said processing chamber having a workpiece support surface facing said ceiling and defining a workpiece processing region between said workpiece support surface and said ceiling, said electron beam opening facing said workpiece processing region;
   an electron beam source chamber comprising an electron beam source chamber enclosure that is open to said electron beam opening of said workpiece processing chamber;
   an array of plasma sources distributed along a portion of said electron beam source chamber enclosure opposite from said electron beam opening, each of said plasma sources comprising a supply of plasma source power and a plasma source power applicator coupled to the supply of plasma source power;
   a controller governing each supply of plasma source power of each of said plasma sources;
   wherein:

said plasma sources comprise respective RF capacitively coupled plasma sources facing respective regions of said electron beam source chamber;

said plasma source power applicator of each of said plasma sources comprises:
  (a) an insulated electrode adjacent said electron beam source chamber enclosure and facing a respective one of said regions; and
  (b) wherein said insulated electrode is coupled to the corresponding plasma source power supply.

2. The plasma reactor of claim 1 wherein said array of plasma sources is distributed along a direction parallel with a plane of said workpiece support surface.

3. The plasma reactor of claim 2 wherein said plasma sources affect plasma electron density in respective portions of said electron beam source chamber, said respective portions distributed along a direction parallel with a plane of said workpiece support surface.

4. The plasma reactor of claim 3 wherein said controller governs plasma electron distribution along said direction.

5. The plasma reactor of claim 1 wherein said electron beam opening has a width and a height corresponding to a width and height of said workpiece processing region.

6. The plasma reactor of claim 1 further comprising:
  a conductive extraction grid across said electron beam opening;
  a conductive acceleration grid across said electron beam opening between said conductive extraction grid and said workpiece processing region;
  an acceleration voltage supply connected between said conductive extraction grid and said conductive acceleration grid.

7. The plasma reactor of claim 6 wherein said conductive acceleration grid is electrically connected to said processing chamber enclosure.

8. The plasma reactor of claim 1 wherein said plasma source power supply is an RF generator and an RF impedance match, said RF generator being coupled to said insulated electrode through said RF impedance match.

9. A plasma reactor for processing a workpiece, comprising:
  a workpiece processing chamber having a processing chamber enclosure comprising a ceiling and a side wall and an electron beam opening in said side wall, a workpiece support pedestal in said processing chamber having a workpiece support surface facing said ceiling and defining a workpiece processing region between said workpiece support surface and said ceiling, said electron beam opening facing said workpiece processing region;
  an electron beam source chamber comprising an electron beam source chamber enclosure that is open to said electron beam opening of said workpiece processing chamber, said electron beam opening defining an electron beam flow path from said electron beam source chamber to said workpiece processing region;
  said electron beam source chamber further comprising an array of plasma sources distributed along a direction transverse to said electron beam flow path, each of said plasma sources comprising a supply of plasma source power and a plasma source power applicator coupled to the supply of plasma source power;
  a controller governing each supply of plasma source power of each of said plasma sources;
  wherein:
  said plasma sources comprise respective RF capacitively coupled plasma sources facing respective regions of said electron beam source chamber;
  said plasma source power applicator of each of said plasma sources comprises:
    (a) an electrode adjacent said electron beam source chamber enclosure and facing a respective one of said regions; and
    (b) wherein said electrode is coupled to the corresponding plasma source power supply.

10. The plasma reactor of claim 9 wherein said array of plasma sources is distributed along a direction parallel with a plane of said workpiece support surface.

11. The plasma reactor of claim 10 wherein said plasma sources affect plasma electron density in respective portions of said electron beam source chamber, said respective portions distributed along a direction parallel with a plane of said workpiece support surface.

12. The plasma reactor of claim 11 wherein said controller governs plasma electron distribution along said direction.

13. The plasma reactor of claim 9 wherein said electron beam opening has a width and a height corresponding to a width and height of said workpiece processing region.

14. The plasma reactor of claim 9 further comprising:
  a conductive extraction grid across said electron beam opening;
  a conductive acceleration grid across said electron beam opening between said conductive extraction grid and said workpiece processing region;
  an acceleration voltage supply connected between said conductive extraction grid and said conductive acceleration grid.

15. The plasma reactor of claim 14 wherein said conductive acceleration grid is electrically connected to said processing chamber enclosure.

16. The plasma reactor of claim 9 wherein said plasma source power supply is an RF generator and an RF impedance match, said RF generator being coupled to said insulated electrode through said RF impedance match.

* * * * *